(12) United States Patent
Tayal

(10) Patent No.: US 9,865,331 B2
(45) Date of Patent: Jan. 9, 2018

(54) AMPLIFIER

(71) Applicant: TAIWAN SEMICONDUCTOR MANUFACTURING COMPANY, LTD., Hsinchu (TW)

(72) Inventor: Mayank Tayal, Ottawa (CA)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/710,653

(22) Filed: May 13, 2015

(65) Prior Publication Data

US 2015/0243349 A1 Aug. 27, 2015

Related U.S. Application Data

(62) Division of application No. 13/920,506, filed on Jun. 18, 2013, now Pat. No. 9,053,817.

(60) Provisional application No. 61/799,884, filed on Mar. 15, 2013.

(51) Int. Cl.
| | |
|---|---|
| G11C 11/412 | (2006.01) |
| G11C 11/419 | (2006.01) |
| G11C 7/00 | (2006.01) |
| G11C 7/12 | (2006.01) |
| G11C 5/06 | (2006.01) |
| G11C 7/06 | (2006.01) |
| G11C 11/4091 | (2006.01) |
| G11C 16/28 | (2006.01) |

(52) U.S. Cl.
CPC ............ *G11C 11/419* (2013.01); *G11C 7/062* (2013.01); *G11C 11/412* (2013.01); *G11C 7/06* (2013.01); *G11C 7/065* (2013.01); *G11C 7/067* (2013.01); *G11C 7/12* (2013.01); *G11C 11/4091* (2013.01)

(58) Field of Classification Search
CPC ..... G11C 11/419; G11C 7/062; G11C 11/412; G11C 7/06; G11C 7/065; G11C 7/067; G11C 7/12; G11C 11/4091
USPC ............... 365/154, 155, 156, 202, 203, 207, 365/189.11, 205, 63
See application file for complete search history.

(56) References Cited

U.S. PATENT DOCUMENTS

| | | | | |
|---|---|---|---|---|
| 4,743,784 | A * | 5/1988 | Obara .............. | H03K 3/356095 327/213 |
| 5,231,318 | A * | 7/1993 | Reddy .................... | G11C 7/062 326/56 |
| 5,315,555 | A * | 5/1994 | Choi .................... | G11C 11/4091 365/196 |

(Continued)

*Primary Examiner* — Ly D Pham
(74) *Attorney, Agent, or Firm* — Hauptman Ham, LLP

(57) ABSTRACT

A circuit includes a plurality of first circuits, a selection circuit, and a second circuit. The selection circuit is configured to selectively couple a first circuit of the plurality of first circuits with the second circuit. The first circuit includes a first data line and a second data line; and a pair of cross-coupled transistors of a first type coupled with the first data line and the second data line. The second circuit includes a first switching circuit and a second switching circuit; and a pair of cross coupled transistors of a second type different from the first type. The pair of cross-coupled transistors of the first circuit and the pair of cross-coupled transistors of the second circuit are configured as part of a sense amplifier when the first switching circuit and the second switching circuit are turned on.

20 Claims, 12 Drawing Sheets

(56) References Cited

U.S. PATENT DOCUMENTS

| | | | | |
|---|---|---|---|---|
| 5,323,350 A * | 6/1994 | McLaury | G11C 11/4091 | 365/189.011 |
| 5,553,028 A * | 9/1996 | McLaury | G11C 11/4097 | 365/205 |
| 5,602,785 A * | 2/1997 | Casper | G11C 11/4091 | 365/189.11 |
| 5,636,158 A * | 6/1997 | Kato | G11C 5/025 | 365/205 |
| 5,657,277 A * | 8/1997 | Shirley | G11C 7/14 | 365/149 |
| 5,677,878 A * | 10/1997 | Shirley | G11C 7/1048 | 365/189.11 |
| 5,732,026 A * | 3/1998 | Sugibayashi | G11C 7/18 | 365/189.05 |
| 5,732,033 A * | 3/1998 | Mullarkey | G11C 7/12 | 365/200 |
| 5,754,478 A * | 5/1998 | Morgan | G11C 7/06 | 365/149 |
| 5,774,408 A * | 6/1998 | Shirley | G11C 7/06 | 365/207 |
| 5,881,006 A * | 3/1999 | Yabe | G11C 7/065 | 365/203 |
| 5,905,672 A * | 5/1999 | Seyyedy | G11C 11/22 | 365/145 |
| 6,018,172 A * | 1/2000 | Hidaka | H01L 27/10882 | 257/296 |
| 6,088,286 A * | 7/2000 | Yamauchi | G11C 11/4074 | 365/230.03 |
| 6,304,494 B1 * | 10/2001 | Arimoto | G11C 7/06 | 365/189.09 |
| 6,711,051 B1 * | 3/2004 | Poplevine | G11C 11/419 | 365/154 |
| 6,754,121 B2 * | 6/2004 | Worley | G11C 7/065 | 365/154 |
| 7,002,855 B2 * | 2/2006 | Wijeratne | G11C 8/10 | 365/154 |
| 7,355,881 B1 * | 4/2008 | Dankert | G11C 7/1057 | 365/154 |
| 8,755,217 B2 | 6/2014 | Kuroda | | |
| 2002/0154561 A1 * | 10/2002 | Graaff | G11C 7/065 | 365/205 |
| 2003/0012047 A1 * | 1/2003 | Morgan | G11C 11/4097 | 365/63 |
| 2004/0174190 A1 * | 9/2004 | Li | G11C 7/065 | 327/55 |
| 2005/0024965 A1 * | 2/2005 | Nakamura | G11C 7/02 | 365/207 |
| 2007/0109893 A1 | 5/2007 | Wood | | |
| 2008/0084730 A1 * | 4/2008 | Hoya | G11C 11/22 | 365/145 |
| 2009/0279348 A1 | 11/2009 | Hirabayashi | | |
| 2010/0202192 A1 * | 8/2010 | Elvira Villagra | G11C 11/413 | 365/154 |

* cited by examiner

US 9,865,331 B2

AMPLIFIER

PRIORITY CLAIM

The present application is a divisional of U.S. application Ser. No. 13/920,506, filed Jun. 18, 2013, which claims priority to U.S. Provisional Application No. 61/799,884, filed Mar. 15, 2013, which are incorporated herein by reference in their entireties.

FIELD

The present disclosure is related to an amplifier.

BACKGROUND

In a memory cell coupled with a first bit line, such as a bit line BL, and a second bit line, such as a bit line BLB, a voltage difference between bit lines BL and BLB develops during a read operation of the memory cell. The voltage difference is called a bit line split. When the bit line split is sufficiently large, the sense amplifier is turned on to sense and amplify the bit line split. Usually, the bit line split is considered sufficiently large when the bit line split is greater than a sensing threshold of the amplifier. In some approaches, the sensing threshold is based on a statistical sigma value of the offset of the sense amplifier. Effectively, the sense amplifier has to wait for the bit line split to develop above the sensing threshold before the sense amplifier is turned on. In many situations, the wait time for the sense amplifier to be turned on is about 40% to 60% of an overall read access time of the memory cell.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
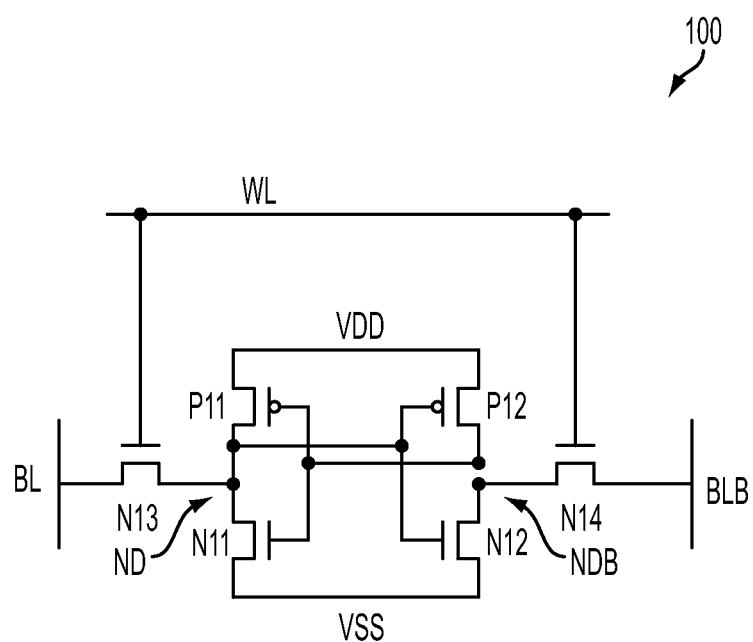
FIG. 1 is a diagram of a memory cell, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. A sensing circuit including a sense amplifier operates with a memory cell in which an offset of the sense amplifier is reduced compared with a sense amplifier of another approach. As a result, a sensing speed of the sensing circuit increases. The layout area and leakage current from a supply voltage VDD through transistors of the sensing circuit to reference supply voltage VSS are also better. In some embodiments, compared with another approach, a die area of the sensing circuit improves about 10%, a speed improves about 5%, and an active and leakage current improve about 5%.

For simplicity, a source terminal, a gate terminal, and a drain terminal of a transistor is called a source, a gate, and a drain, respectively.

Memory Cell

FIG. 1 is a diagram of a memory cell 100, in accordance with some embodiments. Memory cell 100 is also called a register file.

Memory cell 100 includes two P-type metal oxide semiconductor (PMOS) transistors P11 and P12, and four N-type metal oxide semiconductor (NMOS) transistors N11, N12, N13, and N14. Transistors P11, P12, N11, and N12 form a cross latch or a pair of cross-coupled inverters. For example, transistors P11 and N11 form a first inverter while transistors P12 and N12 form a second inverter. Drains of transistors P11 and N11 are coupled together and form a node ND. Drains of transistors P12 and N12 are coupled together and form a node NDB. Gates of transistors P11 and N11 are coupled together and with drains of transistors P12 and N12. Gates of transistors P12 and N12 are coupled together and with drains of transistors P11 and N11.

A word line WL is coupled with a gate of each of transistors N13 and N14. In a row of memory cells 100, word line WL is coupled with a gate of each of transistors N13 and N14 of a plurality of memory cells in the row of memory cells. Word line WL is also called a control line because the signal on word line WL turns and off transistors N13 and N14 for data on bit lines BL and BLB to be transferred from and to corresponding nodes ND and NDB.

Drains of each of transistors N13 and N14 are coupled to bit lines BL and BLB, respectively. In a column of memory cells 100, bit lines BL and BLB are coupled with each drain of transistors N13 and N14 of a plurality of memory cells in the column of memory cells. Each of bit lines BL and BLB is also called a data line because data carried on bit lines BL and BLB are written to and read from corresponding nodes ND and NDB.

In a write operation of memory cell 100, bit lines BL and BLB are applied with logical values to be written to corresponding nodes ND and NDB. Word line WL is then activated to turn on transistors N13 and N14. As a result, the data on bit lines BL and BLB are transferred to corresponding nodes ND and NDB.

In a read operation, bit lines BL and BLB are pre-charged to a pre-determined logical value. For example, in a VDD-sensing architecture, bit lines BL and BLB are pre-charged to a high logical value at a voltage value of supply voltage VDD. In a VSS-sensing architecture, bit lines BL and BLB are pre-charged to a low voltage value of reference supply voltage VSS. For illustration, the below description is in the exemplary context of a VDD-sensing architecture. The technical concepts described using a VDD-sensing architecture are also applicable in a VSS-sensing architecture.

For illustration in a VDD-sensing architecture, bit lines BL and BLB are pre-charge to a high logical value. Word line WL is then activated to turn on transistors N13 and N14. The data in nodes ND and NDB are therefore transferred to bit lines BL and BLB. Based on a low logical value of the data stored in a corresponding node ND or node NBD, one bit line is pulled towards a low logical value and the other bit line remains at the same pre-charged high logical value. In other words, a bit line split between bit lines BL and BLB develops. When the bit line split is sufficiently large, a sense amplifier is turned on to sense the bit line split between bit lines BL and BLB and reveals the data stored in nodes ND and NDB.

For illustration, node ND stores a low logical value, and node NDB stores a high logical value. Because bit line BLB is logically high, node NDB, via the then turned-on transistor N14, remains at the high logical value. Because node NDB is at a gate of NMOS transistor N11 and has a high logical value, NMOS transistor N11 is turned on. Because both transistors N13 and N11 are turned on, bit line BL is pulled towards reference voltage VSS or ground at the source of NMOS transistor N11. As bit line BLB stays at the same high logical value and bit line BL is pulled towards a low logical value, a bit line split between bit lines BL and BLB develops. When the bit line split is sufficiently large, the sense amplifier is turned on to sense the bit line split and recognizes bit line BL being pulled towards a low logical value. In other words, the sense amplifier recognizes that node ND stores a low logical value and node NDB therefore stores a high logical value.

When node ND stores a high logical value, node NDB stores a low logical value. Sensing node ND storing a high logical value is similar to sensing node NDB storing a low logical value. Operations to sense node NDB having a low logical value with reference to NMOS transistors N14, N12 and bit line BLB are similar to operations to sense node ND having a low logical value with reference to NMOS transistors N13, N11 and bit line BL as explained above.

Memory Circuit

Figure 2:
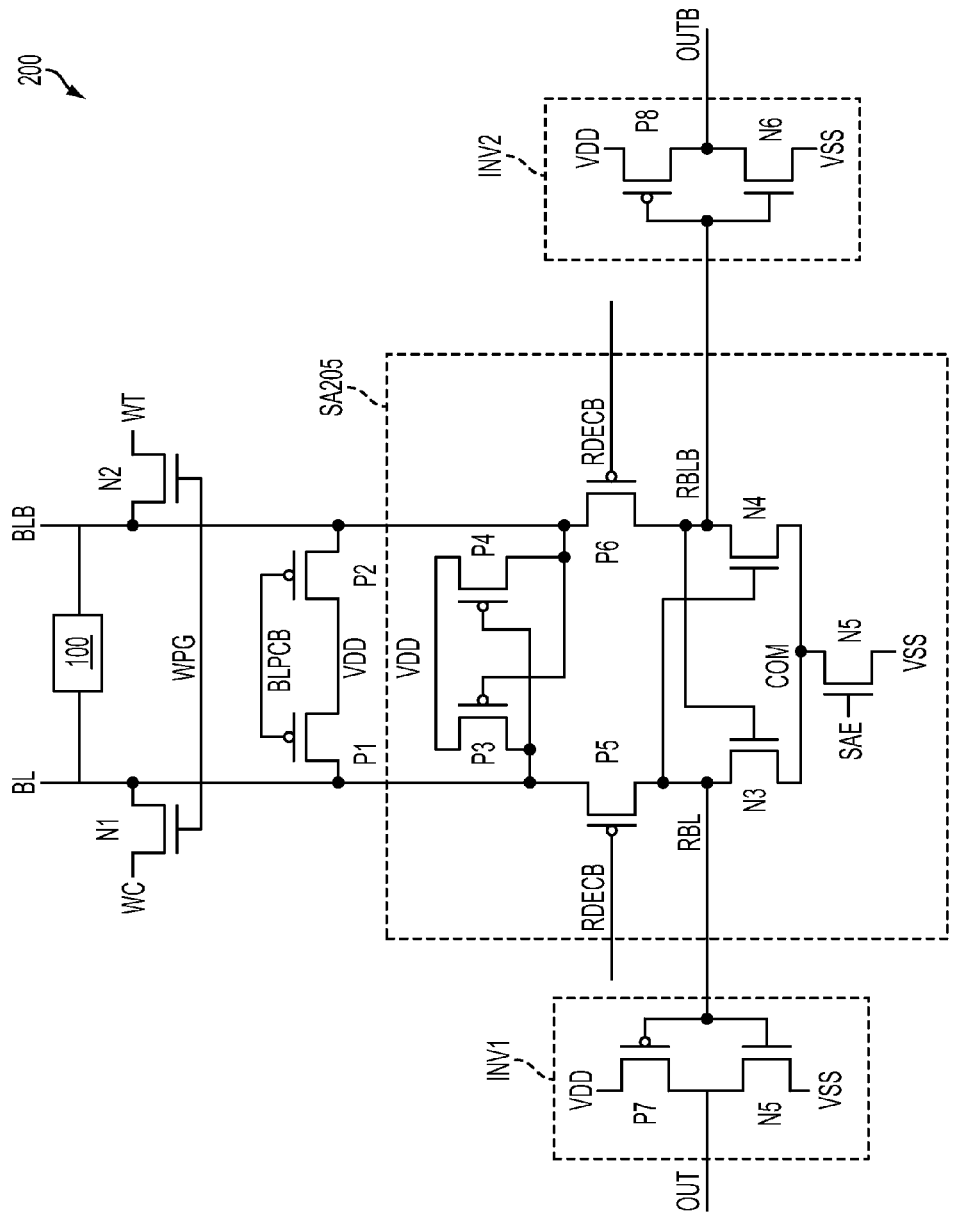
FIG. 2 is a diagram of a memory circuit having an amplifier, in accordance with some embodiments.

FIG. 2 is a diagram of a memory circuit 200, in accordance with some embodiments. Memory circuit 200 includes circuits to write data to and read data from memory cell 100 in FIG. 1. Reading data is also called sensing data.

A memory cell 100 in FIG. 1 is shown coupled with bit lines BL and BLB, and is for illustration. In some embodiments, a plurality of memory cells 100 in a column of a memory array are coupled with bit lines BL and BLB. Exemplary numbers of memory cells 100 in a column include 126, 256, 512, etc.

A signal WPG and NMOS transistors N1 and N2 are called a write data circuit, and are used in a write operation of memory cell 100. For example, in a write operation, data to be written to memory cells 100 are placed as signal WC and signal WT at drains of respective transistors N1 and N2. Transistors N1 and N2 are turned on based on a signal WPG at gates of transistors N1 and N2. As a result, the data is transferred to corresponding bit lines BL and BLB, which is transferred to nodes ND and NDB as explained with reference with FIG. 1. Transistors N1 and N2 are used for illustration. Other circuits used to transfer signals WC and WT to corresponding bit lines BL and BLB are within the contemplated scope of the present disclosure.

A signal BLPCB and PMOS transistors P1 and P2 are used to pre-charge bit lines BL and BLB. Pre-charge refers to charging before a read or a write operation. For example, when signal BLPCB at gates of transistors P1 and P2 are logically low, transistors P1 and P2 are turned on. As a result, by operations of PMOS transistor P1, a voltage value at the source of transistor P1 or voltage VDD equals a voltage value at the drain of transistor P1. Similarly, by operation of PMOS transistor P2, a voltage value at the source of transistor P2 or voltage VDD equals a voltage value at the drain of transistor P2. Because the drain of PMOS transistor P1 is coupled with bit line BL and the drain of PMOS transistor P2 is coupled with bit line BLB, a voltage value on bit lines BL and on BLB equals to voltage VDD. Effectively, bit line BL and bit line BLB are pre-charged to a high voltage value of voltage VDD. Transistors P1 and P2 are used for illustration. Other circuits used to pre-charge bit line BL and bit line BLB are within the contemplated scope of the present disclosure.

In some embodiments, when bit lines BL and BLB are pre-charged, transistors P5 and P6 are turned on. As a result, bit lines RBL and RBLB are electrically coupled with corresponding bit lines BL and BLB. Effectively, bit lines RBL and RBL are also pre-charged as bit lines BL and BLB. For illustrations, a signal on bit lines BL, BLB, RBL, and RBLB is called SBL, SBLB, SRBL, and SRBLB, respectively. Signals SBL, SBLB, SRBL, and SRBLB are not labeled.

In some embodiments, because bit lines BL and BLB are coupled with a plurality of memory cells 100, capacitance of memory cells 100 result in additional capacitance on bit lines BL and BLB. As a result, total capacitance of bit line RBL is lower than that of bit line BL because bit line RBL, by separation of transistor P5, is not affected by capacitance of memory cells 100. Similarly, total capacitance of bit line RBLB is lower than that of bit line BLB.

Because of the difference in capacitance between bit line BL and bit line RBL, even though when bit line BL is electrically coupled with bit line RBL, signal SRBL is not affected by the capacitance on bit line RBL as much as a signal SBL is affected by the capacitance on bit line BL. For example, when transistor P5 is turned on, bit line BL and bit line RBL are electrically coupled together. When signals SBL and SRBL are pulled from a high logical value towards a low logical value at the source of transistor N5, signal SRBL transitions towards the low logical value faster than signal SBL does. Similarly, when transistor P6 is turned on, when signals SBLB and SRBLB are pulled from a high logical value towards a low logical value, signal SRBLB transitions towards the low logical value faster than signal SBLB does.

Various embodiments of the present disclosure are advantageous over other approaches because, in the various embodiments, sensing data for memory cell 100 is done by processing data on bit line RBL and/or bit line RBLB. In contrast, in other approaches, sensing data for memory cell 100 is done by processing data on bit line BL and/or bit line BLB, which have more capacitance than that of corresponding bit lines RBL and RBLB.

PMOS transistors P5 and P6 each function as a switch for circuit 200 to switch between a write operation and a read operation. For example, in a write operation, signal RDECB at gates of transistors P5 and P6 are logically high. As a result, transistors P5 and P6 are turned off, and bit lines BL and BLB are electrically disconnected from transistors N3 and N4. In contrast, in a read operation, signal RDECB is logically low, and transistors P5 and P6 are turned on. Signals on bit line BL and bit line BLB that represent the data stored in memory 100 are transferred through transistors P5 and P6 to corresponding bit line RBL and bit line RBLB, to be processed by inverters INV1 and INV2, for example.

A sense amplifier SA205 includes PMOS transistors P3, P4, P5, P6, and NMOS transistors N3, N4, and N5. PMOS transistors P3 and P4 form a first pair of cross-coupled transistor for sense amplifier SA205. For example, sources of transistors P3 and P4 are coupled together. A gate of transistor P3 is coupled with a drain of transistor P4, and a gate of transistor P4 is coupled with a drain of transistor P3. NMOS transistors N3 and N4 form a second pair of cross-coupled transistor for sense amplifier SA205. For example, sources of transistors N3 and N4 are coupled together. A gate of transistor N3 is coupled with a drain of transistor N4, and a gate of transistor N4 is coupled with a drain of transistor N3. In a read operation, transistors P5 and P6 are turned on, and function as an electrical short circuit. Transistors P3, P4, N3, and N4 then perform the sensing function of sense amplifier SA205. Details of how transistors P3, P4, P5, P6, N3, N4, and N5 function are explained with reference to FIGS. 3, 4, 5, and 6 below.

Inverters INV1 and INV2 form a read data circuit, and are used to process data on bit line RBL and bit line RBLB. Inverter INV1 includes PMOS transistor P7 and NMOS transistor N6, and inverts the data on bit line RBL to provide data on output OUT. Inverter INV1 is used for illustration. Other circuits processing the data on bit line RBL and providing the processed data to another circuit are within contemplated scope of the present disclosure. Similarly, inverter INV2 includes PMOS transistor P8 and NMOS transistor N7, and inverts the data on bit line RBLB to provide the data on output OUTB. Inverter INV2 is used for illustration. Other circuits processing the data on bit line RBL and providing the processed data to another circuit are within contemplated scope of the present disclosure.

When both signals on bit lines RBL and RBLB are used as output signals for circuit 200, circuit 200 is called a differential circuit. "Differential" refers to the fact that the data processed by sense amplifier SA205 is represented by a differential voltage or a bit line split of bit line BL and bit line BLB and corresponding bit line RBL and RBLB. In the differential circuit when both bit lines RBL and RBLB are used, both inverters INV1 and INV2 are used.

When either a bit line RBL or a bit line RBLB is used to represent the data processed by sense amplifier SA205, circuit 200 is call a single-ended circuit. For example, in a single-ended circuit that bit line RBL is used, corresponding inverter INV1 is used. In such a situation, bit line RBLB and inverter INV2 are not used. Similarly, in a single-ended circuit that bit line RBLB is used, corresponding inverter INV2 is used, but bit line RBL and inverter INV1 are not used.

Circuit 200 shown to include memory cell 100 and transistors N1, N2 is for illustration. Memory cell 100 and transistors N1, N2 being replaced with another device is within the contemplated scope of the present disclosure. For example, sense amplifier SA205 and inverters INV1, INV2 operate to sense and amplify a differential signal of a dual port memory cell, a differential signal of another device different from a memory cell, etc.

Memory Circuit in a Write Operation

Figure 3:
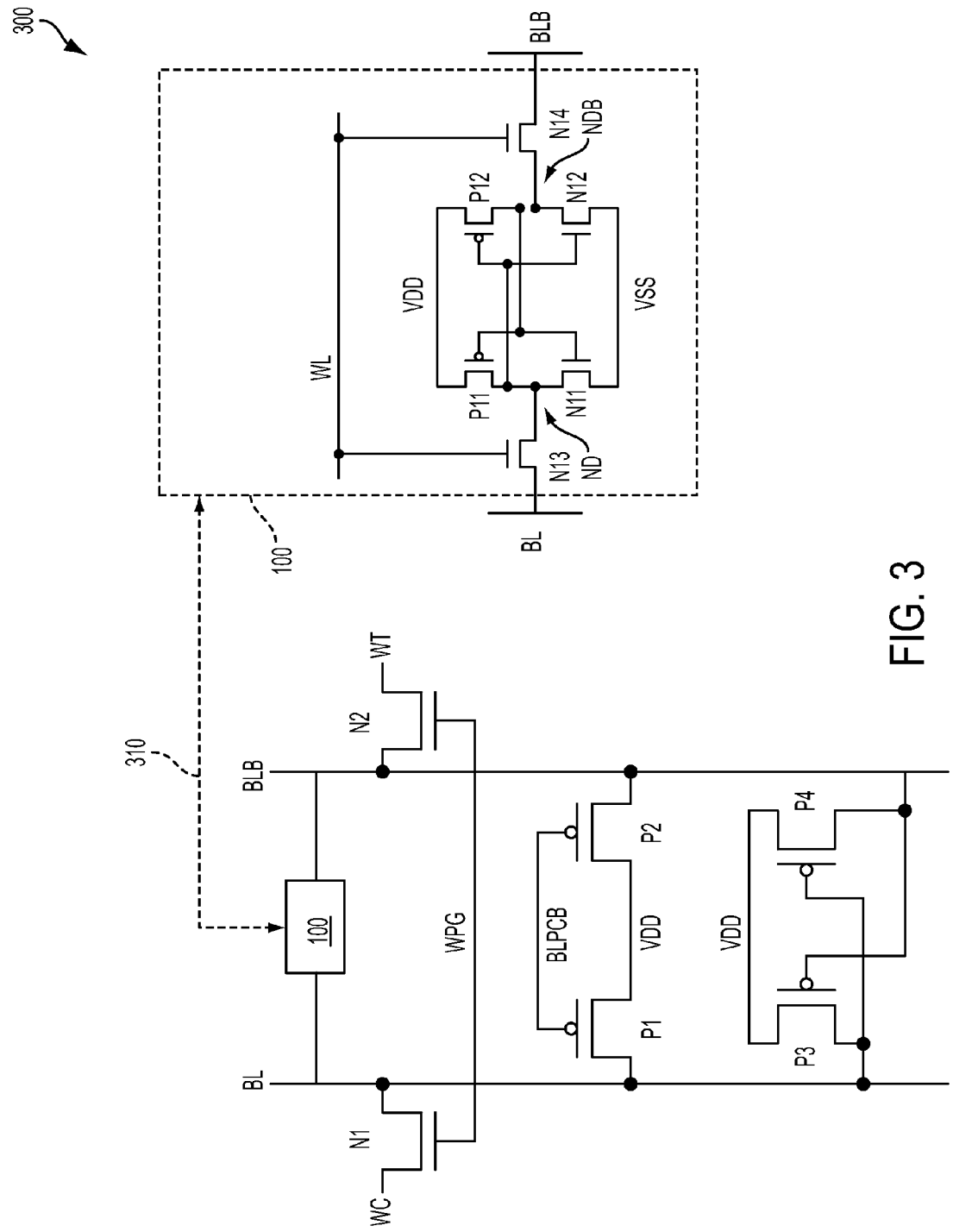
FIG. 3 is a diagram of the memory circuit in FIG. 2, in a write operation, in accordance with some embodiments.

FIG. 3 is a diagram of a circuit 300, in accordance with some embodiments. For illustration, circuit 300 includes active circuit elements of circuit 200 in FIG. 2 when circuit 200 is in a write operation. Explained in another way, when circuit 200 is in a write operation, PMOS transistors P5 and P6 are turned off, and operate as an open circuit. As a result, transistors P5, P6, and circuit elements coupled with the drains of transistor P5 and P6 have no electrical effect on circuit 200 and are therefore not shown in FIG. 3. For ease of illustration, details of memory cell 100 are also shown in FIG. 3 as indicated by a line 310.

Figure 4:
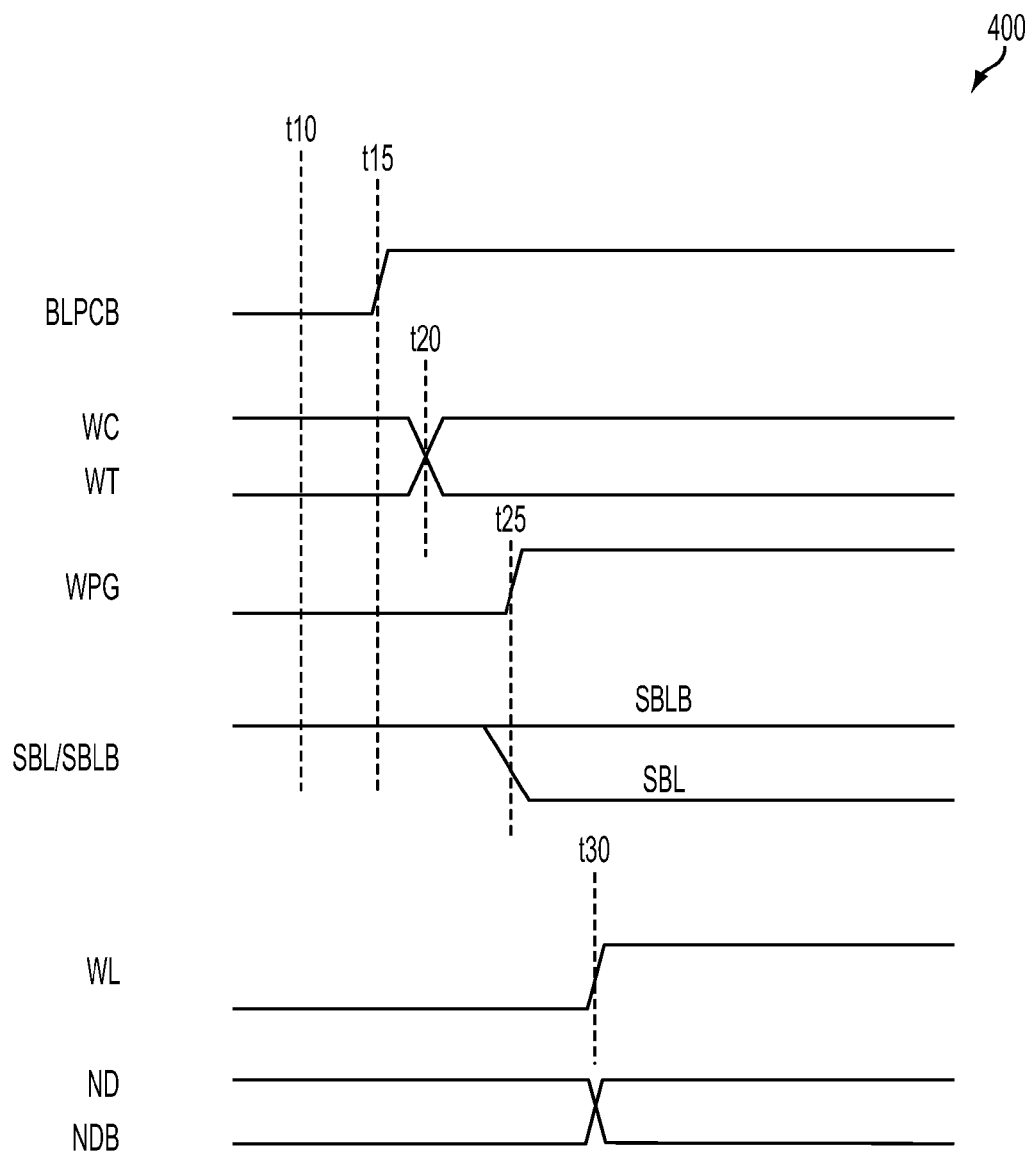
FIG. 4 is a graph of waveforms in a write operation of the memory circuit in FIG. 3, in accordance with some embodiments.

FIG. 4 is graph of waveforms 400, in accordance with some embodiments. Waveforms 400 illustrate a write operation of memory cell 100 in FIG. 3. For illustration, a low and a high logical value are written to nodes ND and NDB of memory cell 100, respectively.

In some embodiments, after a complete write or read operation of a previous cycle, signal BLPCB returns to a low logical value that turns on transistors P1 and P2 in FIG. 3 and pre-charge bit lines BL and BLB to a high logical value.

At a time t10, signal BLPCB continues to be at a low logical value. PMOS transistors P1 and P2 continue to be on, and bit lines BL and BLB continue to be at a pre-charge high logical value. Effectively, signals SBL and SBLB on corresponding bit lines BL and BLB continue to be at a pre-charge high logical value.

At a time t15, signal BLPCB is applied with a high logical value to turn off transistors P1 and P2. Signals SBL and SBLB are therefore floating with the pre-charge high logical value.

At a time t20, a low logical value and a high logical value are applied as signals WC and WT at the drains of transistors N1 and N2, respectively.

At a time t25, signal WPG at the gate of NMOS transistors N1 and N2 is applied with a high logical value to turn on transistors N1 and N2. As a result, bit lines BL and BLB take the low and high logical values of signals WC and WT, respectively. In other words, signal SBL and SBLB are logically low and high, respectively.

At a time t30, word line WL is applied with a high logical value. As a result, transistors N13 and N14 of memory cell 100 are turned on. The low and high logical values of signals SBL and SBLB are transferred to nodes ND and NDB of memory cell 100, respectively. Effectively, nodes ND and NDB are written with a low and a high logical value, respectively.

When signal SBL on bit line BL at the gate of PMOS transistor P4 is logically low, transistor P4 is turned on. Similarly, when signal SBLB on bit line BLB at the gate of PMOS transistor P3 is logically high, PMOS transistor P3 is turned off, and has no electrical effect on circuit 300. Because transistor P4 is turned on, bit line BLB is also pulled to voltage VDD at the source of transistor P4. Effectively, transistor P4 operates to maintain the high logical value of signal SBLB.

Memory Circuit in a Read Operation

Figure 5:
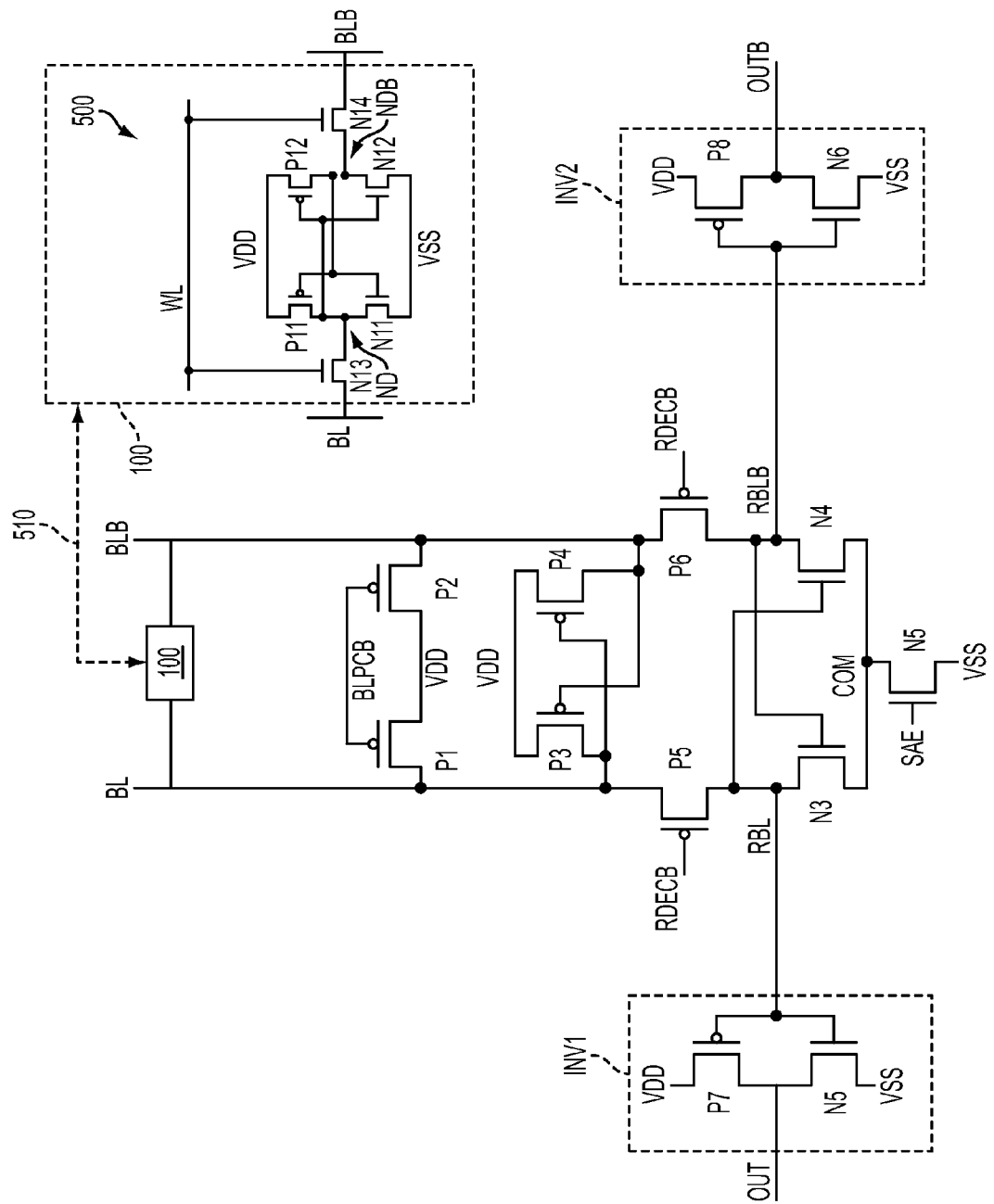
FIG. 5 is a diagram of the memory circuit in FIG. 2, in a read operation, in accordance with some embodiments.

FIG. 5 is a diagram of a circuit 500, in accordance with some embodiments. Circuit 500 includes active circuit elements of circuit 200 in FIG. 2 when circuit 200 is in a read operation. For ease of illustrations, details of memory cell 100 are also shown in FIG. 5 as illustrated by a line 510. Compared with circuit 200, circuit 500 does not include transistors N1 and N2 that are used in a write operation.

Figure 6:
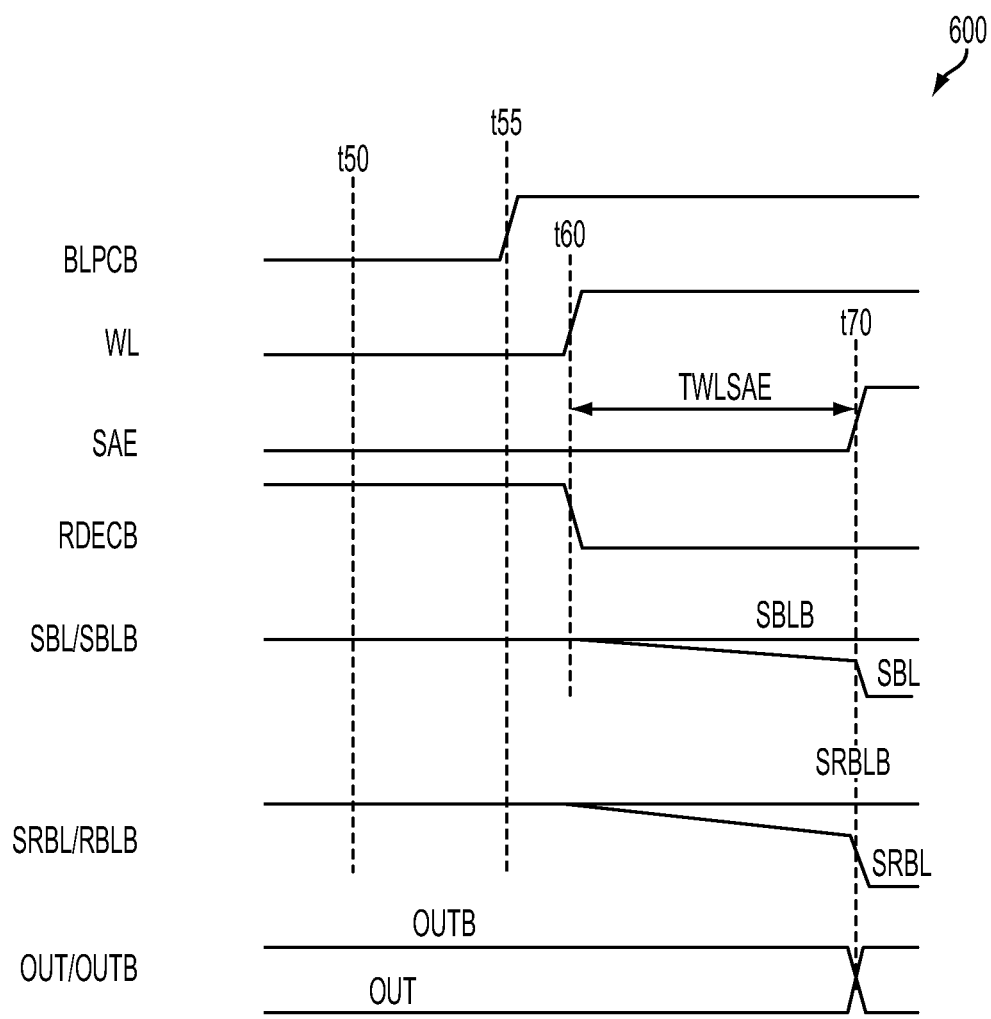
FIG. 6 is a graph of waveforms in a read operation of the memory circuit in FIG. 2, in accordance with some embodiments.

FIG. 6 is graph of waveforms 600, in accordance with some embodiments. Waveforms 600 illustrate a read operation of memory 100 in FIG. 5. For illustration, nodes ND and NDB store a low and a high logical value are, respectively.

In some embodiments, after a complete write or read operation of a previous cycle, signal BLPCB returns to a low logical value that turn on transistors P1 and P2 and pre-charge bit lines BL and BLB in FIG. 5 to a high logical value. As a result, both signals SBL and SBLB are logically high.

At a time t50, signal BLPCB continues to be at a low logical value. PMOS transistors P1 and P2 continue to be on, and signals SBL and SBLB continue to be at a pre-charge high logical value.

At a time t55, signal BLPCB is applied with a high logical value to turn off transistors P1 and P2. Signals SBL and SBLB are therefore floating with the pre-charge high logical value.

At a time t60, word line WL of memory cell 100 is applied with a high logical value. As a result, transistors N13 and N14 of memory cell 100 are turned on, and the data on nodes ND and NDB are transferred to bit lines BL and BLB as signals SBL and SBLB, respectively. A bit line split between bit line BL and bit line BLB starts to develop, as indicated by signal SBL starting to transition towards a low logical value.

At time t60, signal RDECB is also applied with a low logical value to turn on transistors P5 and P6. As a result, bit lines BL and BLB are electrically coupled with bit lines RBL and RBLB. Effectively, as shown in FIG. 6, at time t60, signal SRBL follows signal SBL and transitions towards a low logical value. Because bit line RBL has less capacitance than bit line BL, signal SRBL transitions towards the low logical value faster than signal SBL does. Signal SRBLB follows signal SBLB and stays at a high logical value.

At a time t70, when the bit line split between bit lines RBL and RBLB is sufficient to be sensed by sense amplifier SA205, signal SAE at the gate of transistor N5 is activated with a high logical value. As a result, transistor N5 is turned on and serves as a current path for transistors N3 and N4. In other words, sense amplifier SA205 is turned on.

Because a signal on bit line RBL transitions towards a low logical value while bit line RBLB stays at the same pre-charge high logical value, a voltage level of bit line RBLB at the gate of transistor N3 is higher than a voltage level of bit line RBL at the gate of transistor N4. As a result, transistor N3 has a driving capability stronger than that of transistor N4. Consequently, transistor N3 is turned on before transistor N4. By the time transistor N3 is turned on, transistors N3 and the then turned-on transistor N5 pull bit line RBL to a low logical value at the source of transistor N5. Because bit line RBL at the gate of transistor N4 is logically low, even if transistor N4 is then on, transistor N4 is turned off, and has no electrical effect on other circuit elements.

Signals SRBL and SRBLB are each then processed by inverters INV1 and INV2, respectively. For example, inverter INV1 converts a low logical value of signal SRBL to provide a high logical value for output OUT. Similarly, inverter INV2 converts a high logical value of signal SRBLB to provide a low logical value for output OUTB.

A time from word line WL being activated from a time signal SAE is activated and sense amplifier S205 is turned on is called TWLSAE.

Shared Circuit

In some embodiments, transistors P5, P6, N3, N4, N5 and inverters INV1, INV2 in FIG. 2 are shared by a plurality of columns of a memory array of a memory macro. Sharing of transistors P5, P6, N3, N4, N5 and inverters INV1, INV2 are illustrated with reference to FIGS. 7 and 8.

Figure 7:
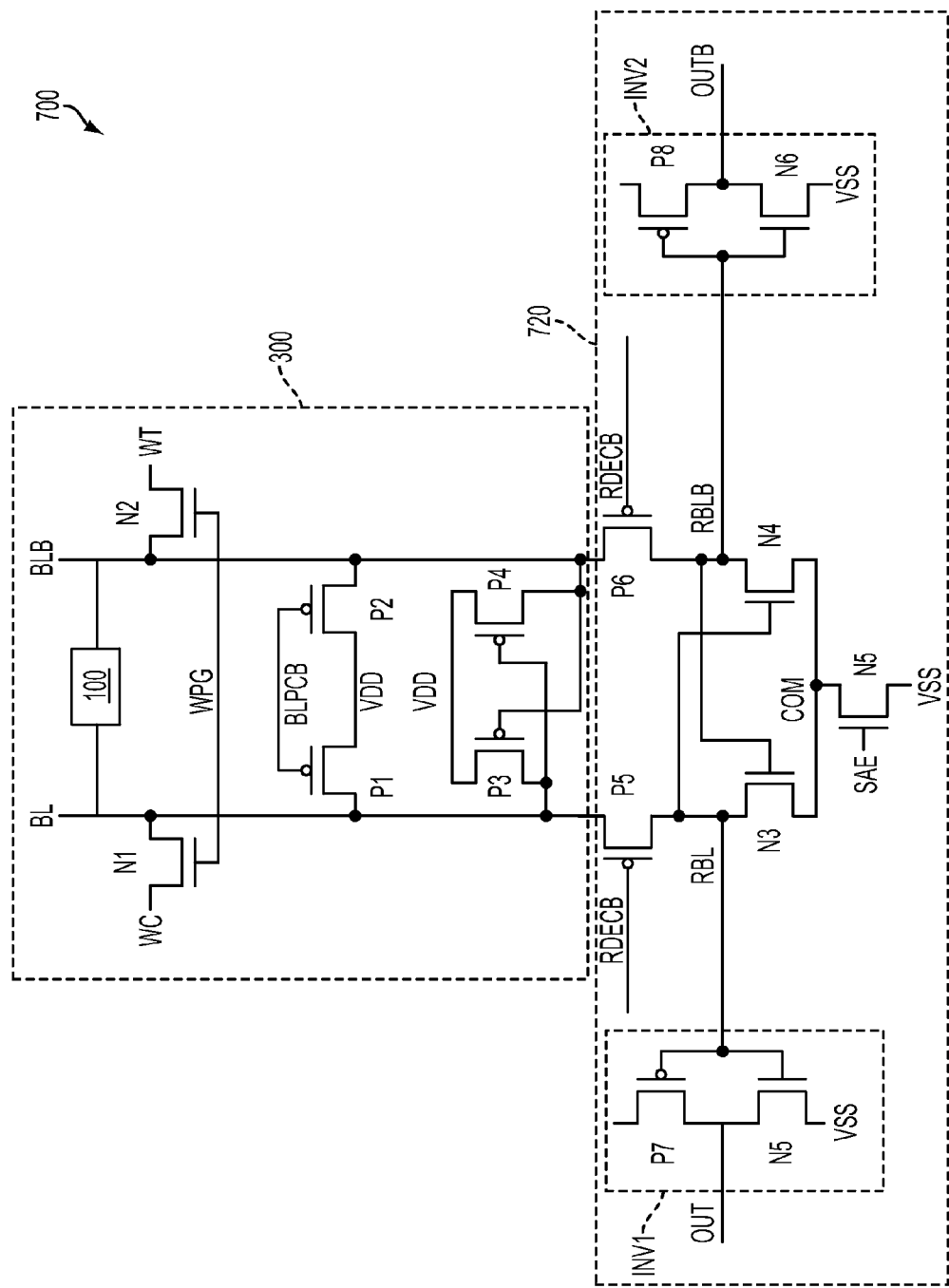
FIG. 7 is a diagram of the memory circuit in FIG. 2, in accordance with some embodiments.

FIG. 7 is a diagram of memory circuit 200, in accordance with some embodiments. Circuit 200 in FIG. 7 is shown to include circuit 300 in FIG. 3 and a circuit 720. As shown, circuit 300 includes transistors N1, N2, P1, P2, P3, P4, and memory cell 100. Circuit 720 includes transistors P5, P6, N3, N4, N5 and inverters INV1, INV2.

Figure 8:
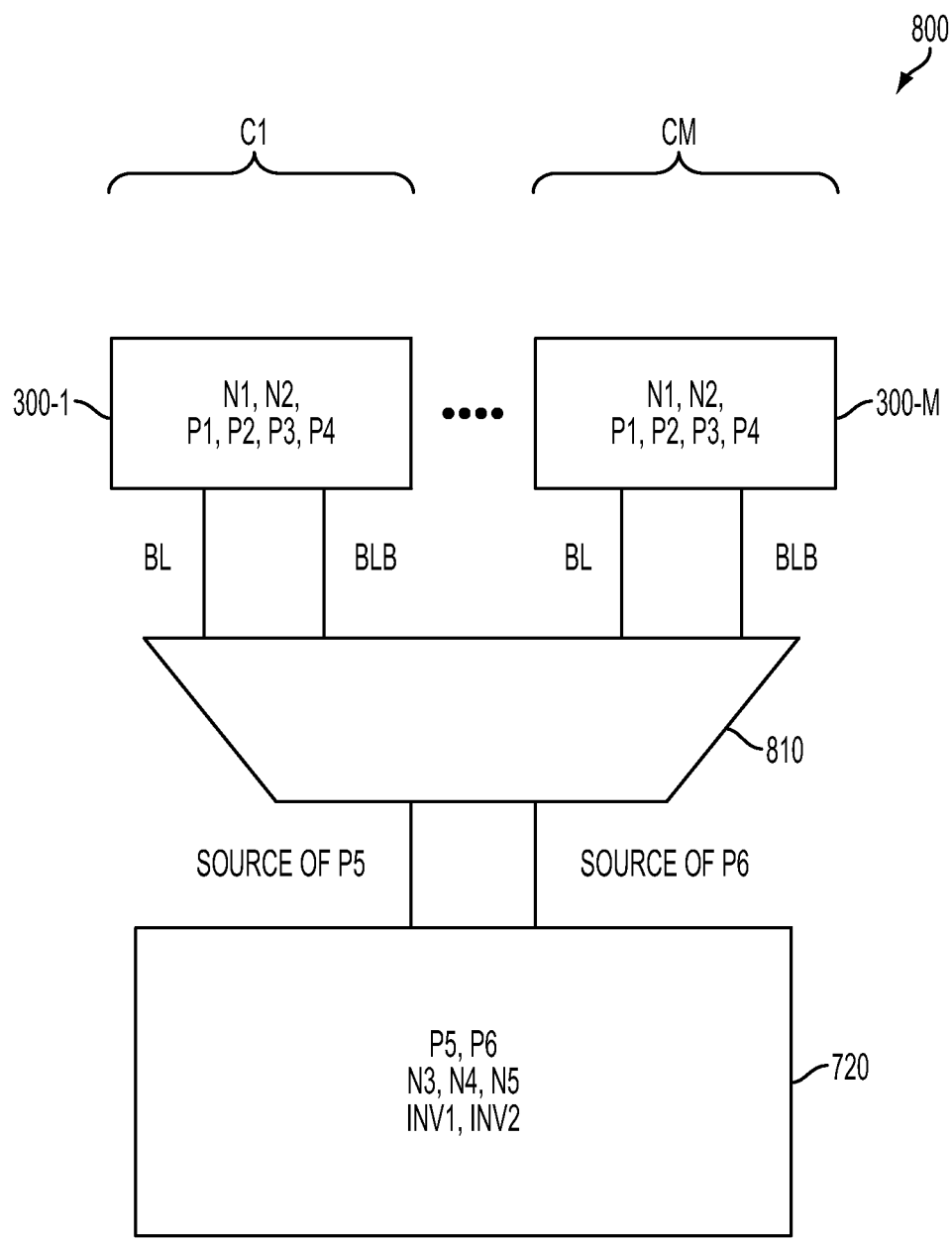
FIG. 8 is a diagram of a circuit having a sub-circuit in FIG. 7 being shared, in accordance with some embodiments.

FIG. 8 is a diagram of a circuit 800, in accordance with some embodiments. FIG. 8 is used to illustrate how circuit 720 in FIG. 7 that includes P5, P6, N3, N4, N5 and inverters INV1, INV2 is shared.

In some embodiments, M circuits 300 designated as circuits 300-1 to 300-M share circuit 720, wherein M is an integer number. Explained in a different way, M columns C1 to CM of a memory array of a memory macro share or use one circuit 720. For illustration, references to transistors N1, N2, P1, P2, P3 and P4 are shown in circuits 300-1 to 300-M. References to transistors P5, P6, N3, N4, N5, and inverters INV1, INV2 are shown in circuit 720.

A selection circuit 810 operates to selectively couple bit lines BL and BLB of a circuit 300 of circuits 300-1 to 300-M with the sources of transistors P5 and P6 of circuit 720, respectively. In some embodiments, selection circuit 810 is a multiplexer. When a circuit 300 is selected by multiplexer 810 to be coupled with circuit 720, the resulting circuit is equivalent to circuit 200 in FIG. 2. For example, the resulting circuit includes transistors N1, N2, P1, P2, P3, P4, P5, P5, N3, N4, N5 and inverters INV1 and INV2 of circuit 200. Operations of the resulting circuit can be referenced to operations of circuit 200 as explained above.

In some embodiments, a memory array of a memory macro includes a plurality of K circuits 800 where K is an integer number. For illustrations, M equals to four, and K equals to sixteen. In such a configuration, the memory includes 64 (=4×16) columns, and every four columns share a multiplexer 810 and a circuit 720. M columns sharing a multiplexer 810 is called a mux-M architecture. In some embodiments, the memory macro includes a mux-4 architecture.

Features and Advantages of Some Embodiments

Various embodiments of the present disclosure are advantageous over other approaches. For example, memory circuit 200 in various embodiments can be used in a single-ended or a differential system. Compared with a single-ended circuit in other approaches, in order to balance capacitance imbalance in bit line BL and bit line BLB, the other approaches include two distinct control signals to each turn on or off a corresponding transistor P5 or P6. In contrast, in some embodiments illustrated in FIG. 2, one control signal RDECB is used to turn on and off transistors P5 and P6 at the same time.

In some embodiments, an output signal, such as a signal on output OUT, represents the data stored in memory cell 100. Further, the output signal is processed based on signal SRBL on bit line RBL at the drains of transistors P5 and N3.

In contrast, the output signal in other approaches is processed based on signal SBL on bit line BL. Because signal SRBL is processed at bit line RBL, and bit line RBL has less capacitance than bit line BL, time TWLSAE in FIG. 6 in various embodiments of the present disclosure is shorter than time TWLSAE in other approaches. Effectively, a read access time of the present disclosure is shorter than that of other approaches. Similarly, if output OUTB is used, the signal on output OUTB is based on signal SRBLB on bit line RBLB at the drains of transistors P6 and N4. In such a condition, bit line RBLB has less capacitance than bit line BLB, and a read access time of the present disclosure is also shorter than that of other approaches.

In a read operation, bit lines BL and BLB in other approaches are amplified to be rail-to-rail, and therefore consume a lot of power. In contrast, in various embodiments of the present disclosure, bit lines RBL and RBLB are amplified to be rail-to-rail. Bit lines BL and BLB follow bit lines RBL and RBLB. However, because bit lines BL and BLB have higher capacitance than bit lines RBL and RBLB, by the time the data on bit lines RBL and RBLB is rail-to-rail, bit lines BL and BLB are not rail-to-rail. As a result, the memory macro of in various embodiments of the present disclosure consumes less power.

In a mux-M architecture, various embodiments of the present disclosure include one circuit 720 for M columns of a memory array of a memory macro. In contrast, in other approaches, each column includes a set of transistors P5, P6, N3, N4, and N5. As a result, other approaches include M sets of transistors P5, P6, N3, N4, and N5. In other words, compared with other approaches, a memory array of a memory macro in various embodiments of the present disclosure uses less transistors. Consequently, in the various embodiments, circuit areas, leakage current, and power consumption are less. Further, in other approaches, without the mux-M architecture, all M columns are sensed in a read operation while only one column in various embodiments of the present disclosure is sensed. As a result, the effect of bit lines BL and BLB being rail-to-rail in other approaches is experienced in all M columns, resulting in additional power consumption in each of M columns. Effectively, various embodiments of the present disclosure save additional power consumption, compared with other approaches.

Compared with a differential system in other approaches, each column in other approaches includes a set transistors P1, P2, P3 and P4 dedicated for a write operation and a another set of transistors P1, P2, P3, and P4 dedicated for a read operation. In contrast, as illustrated in FIG. 2 of the present disclosure, transistors P1, P2, P3, and P4 are shared between a write operation and a read operation. As a result, circuit areas, power consumption, and leakage current in various embodiments of the present disclosure are reduced, compared with other approaches.

Further, in other approaches, in each column, a set of transistors P1, P2, P3, and P4 is coupled with bit lines RBL and RBLB dedicated for a read operation. As a result, capacitance on the corresponding bit lines RBL and RBLB increases and degrades signal performance. In contrast, various embodiments of the present disclosure do not have a set of transistors P1, P2, P3, and P4 coupled with bit lines RBL and RBLB. As a result, bit lines RBL and RBLB have less capacitance, and signal performance of the present disclosure is improved.

Another Memory Circuit

Figure 9:
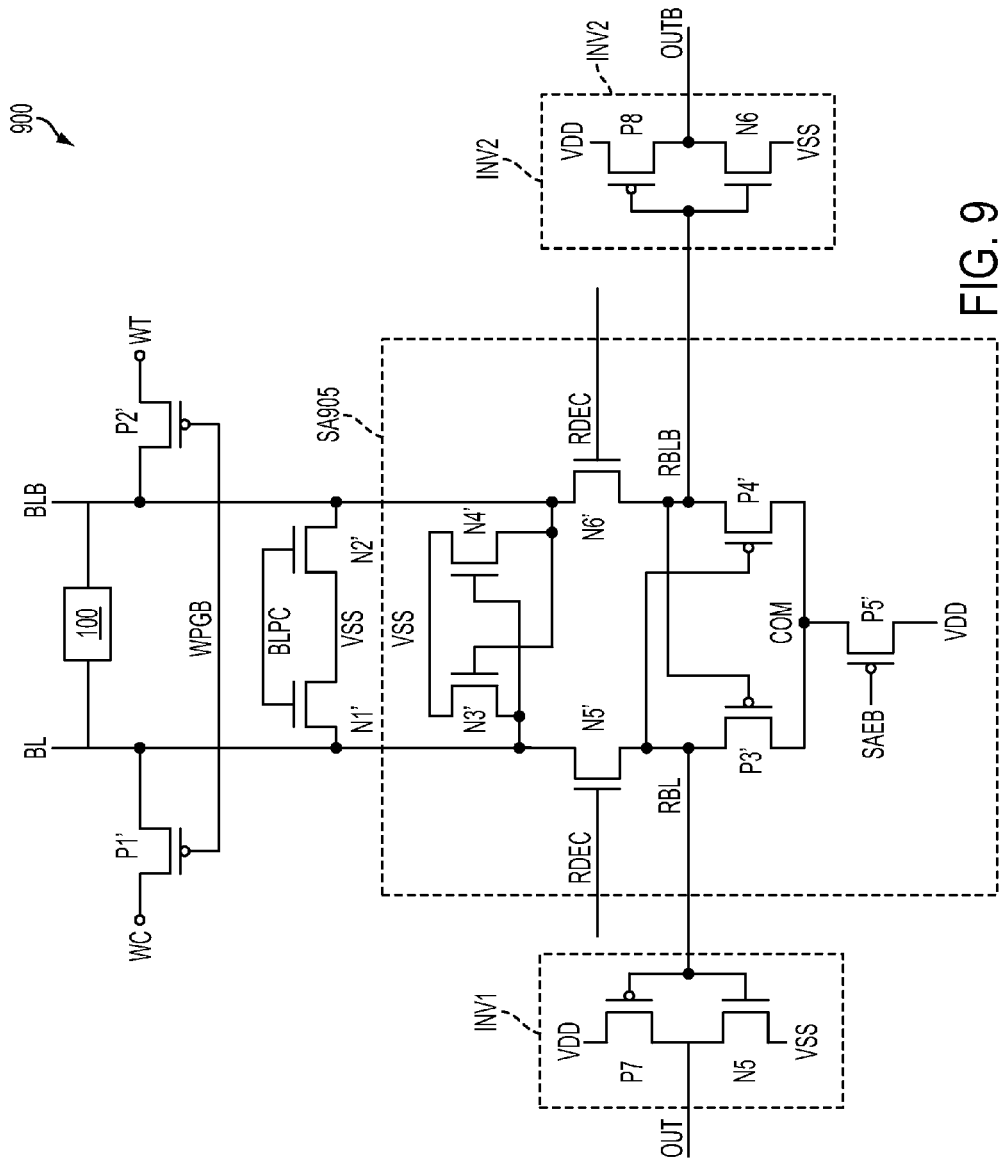
FIG. 9 is a diagram of another memory circuit having a sense amplifier, in accordance with some embodiments.

FIG. 9 is a diagram of a memory circuit 900, in accordance with some embodiments. Memory circuit 900 is based on a VSS-sensing. For example, in a read operation of memory 100, bit lines BL and BLB are pre-charged to a low voltage value of reference supply voltage VSS. The bit line split develops from the VSS pre-charge value, and is then sensed by a sense amplifier. In contrast, memory circuit 200 in FIG. 2 is based on a VDD-sensing. As can be seen from the descriptions of FIG. 2, in a read operation, bit lines BL and BLB are pre-charged to a high voltage value of supply voltage VDD. The bit line split develops from the VDD-pre-charge value, and is then sensed be a sense amplifier.

Compared with circuit 200, except for transistors in inverters INV1 and INV2, NMOS transistors in circuit 900 replace PMOS transistors in circuit 200. For example, NMOS transistors N1', N2', N3', N4', N5', and N6' replace PMOS transistors P1, P2, P3, P4, P5, and P6, respectively. Similarly, PMOS transistors in circuit 900 replace NMOS transistors in circuit 200. For example, PMOS transistors P1', P2', P3', P4', and P5' replace NMOS transistors N1, N2, N3, N4, and N5, respectively.

Because of the changes from PMOS to NMOS transistors and vice versa, various supply voltages and control signals in FIG. 9 are logically complementary to corresponding supply voltages and control signals in FIG. 2. For example, a signal WPGB at gates of PMOS transistors P1' and P2' replaces signal WPG at the gates of NMOS transistors N1 and N2. A signal BLPC at gates of NMOS transistors N1' and N2' replaces signal BLPCB at the gate of PMOS transistors P1 and P2. Reference supply voltage VSS at sources of NMOS transistors N1' and N2' replaces voltage VDD at the sources of PMOS transistors P1 and P2. Reference supply voltage VSS at sources of NMOS transistors N3' and N4' replaces supply voltage VDD at the sources of PMOS transistors P3 and P4. A signal RDEC at gates of NMOS transistors N5' and N6' replaces signal RDECB at the gates of PMOS transistors P5 and P6. A signal SAEB at a gate of PMOS transistor P5' replaces signal SAE at the gate of NMOS transistor N5.

Operations of circuits 900 are similar to operations of circuit 200, considering changes in transistors and signals as described above. For example, writing a high logical value to node ND of memory 100 in circuit 900 is similar to writing a low logical value to node ND of memory 100 in circuit 200.

Figure 10:
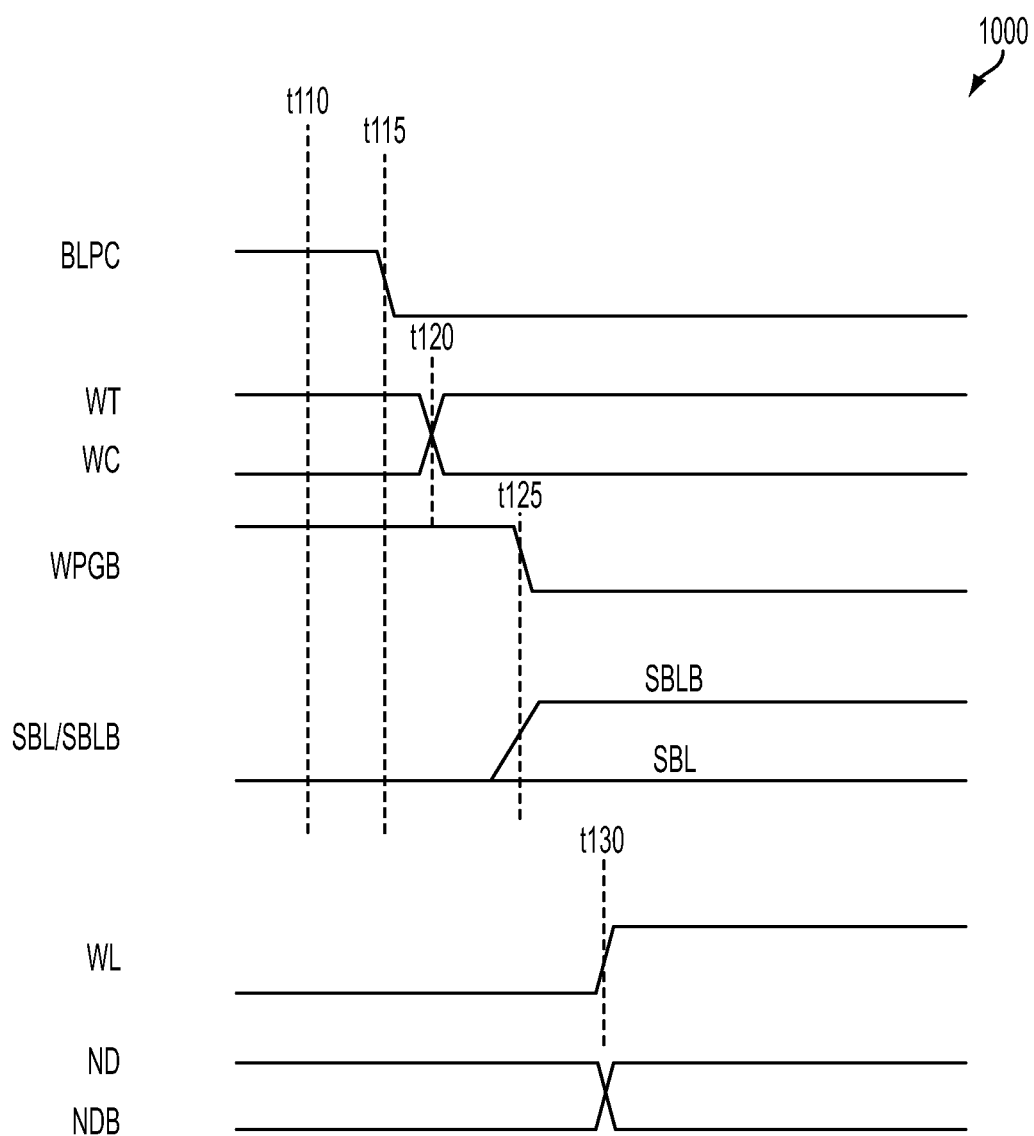
FIG. 10 is a graph of waveforms in a write operation of the memory circuit in FIG. 9, in accordance with some embodiments.

FIG. 10 is graph of waveforms 1000, in accordance with some embodiments. Waveforms 1000 illustrate a write operation of memory cell 100 in FIG. 9. For illustration, a high and a low logical value are written to nodes ND and NDB of memory cell 100 in FIG. 9, respectively.

In some embodiments, after a complete write or read operation of a previous cycle, signal BLPC returns to a high logical value that turns on transistors N1' and N2' in FIG. 9 and pre-charge bit lines BL and BLB to a low logical value.

At a time t110, signal BLPC continues to be at a high logical value. NMOS transistors N1' and N2' continue to be on, and bit lines BL and BLB continue to be at a pre-charge low logical value. Effectively, signals SBL and SBLB on corresponding bit lines BL and BLB continue to be at the pre-charge low logical value.

At a time t115, signal BLPC is applied with a low logical value to turn off transistors N1' and N2'. Signals SBL and SBLB are therefore floating with the pre-charge low logical value.

At a time t120, a high logical value and a low logical value are applied as signals WC and WT at the drains of transistors P1' and P2', respectively.

At a time t125, signal WPGB at the gate of PMOS transistors P1' and P2' is applied with a low logical value to turn on transistors P1' and P2'. As a result, bit lines BL and BLB take the high and low logical values of signals WC and WT, respectively. In other words, signal SBL and SBLB are logically high and low, respectively.

At a time t130, word line WL is applied with a high logical value. As a result, transistors N13 and N14 of memory cell 100 are turned on. The high and low logical values of signals SBL and SBLB are transferred to nodes ND and NDB of memory cell 100, respectively. Effectively, nodes ND and NDB are written with a high and a low logical value, respectively.

When signal SBL on bit line BL at the gate of NMOS transistor N4' is logically high, transistor N4' is turned on. Similarly, when signal SBLB on bit line BLB at the gate of NMOS transistor N3' is logically low, NMOS transistor N3' is turned off, and has no electrical effect on circuit 900. Because transistor N4' is turned on, bit line BLB is also pulled to voltage VSS at the source of transistor N4'. Effectively, transistor N4' operates to maintain the low logical value of signal SBLB on bit line BLB.

Figure 11:
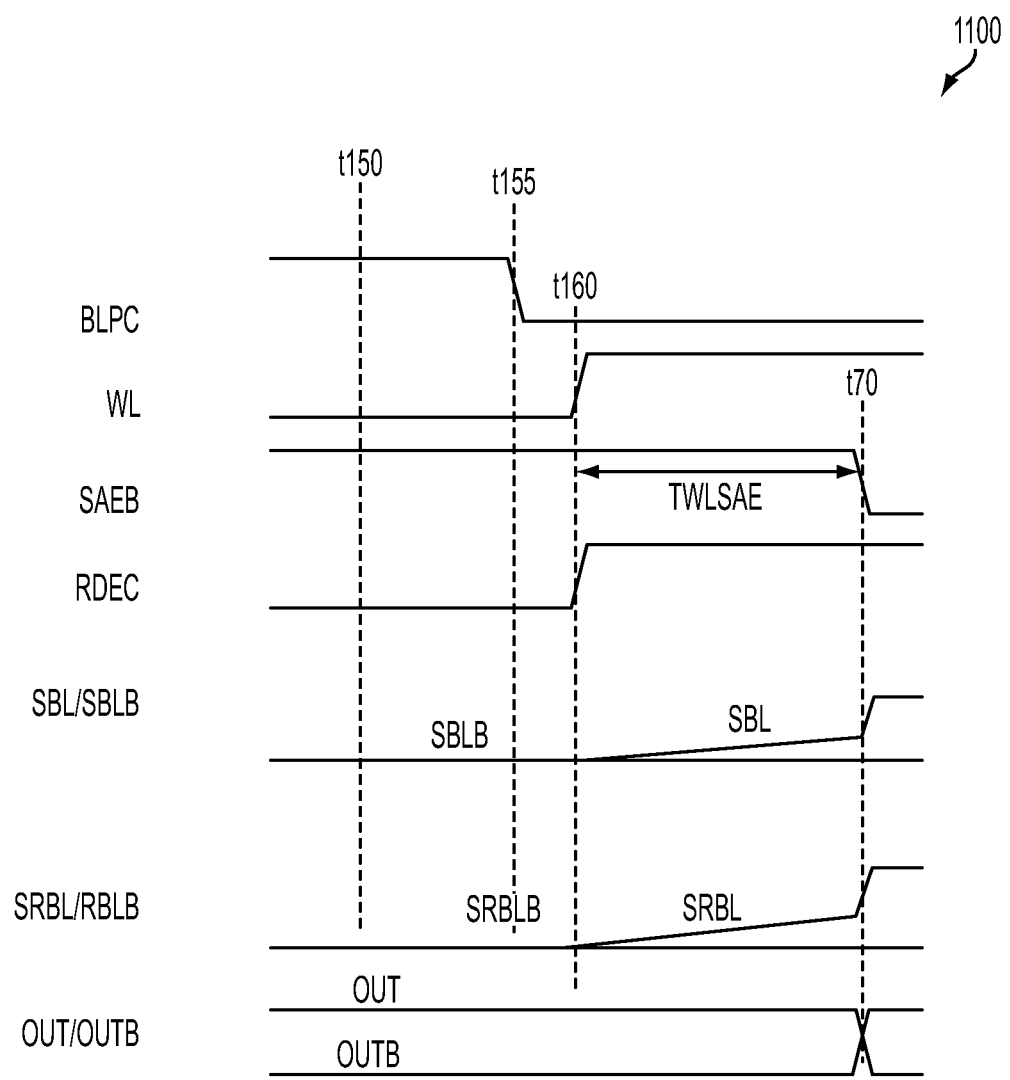
FIG. 11 is a graph of waveforms in a read operation of the memory circuit in FIG. 9, in accordance with some embodiments.

FIG. 11 is graph of waveforms 1100, in accordance with some embodiments. Waveforms 1100 illustrate a read operation of memory 100 in FIG. 9. For illustration, nodes ND and NDB store a high and a low logical value, respectively.

In some embodiments, after a complete write or read operation of a previous cycle, signal BLPC returns to a high logical value that turn on transistors N1' and N2' and pre-charge bit lines BL and BLB in FIG. 5 to a low logical value. As a result, both signals SBL and SBLB are logically low.

At a time t150, signal BLPC continues to be at a high logical value. NMOS transistors N1' and N2' continue to be on, and signals SBL and SBLB continue to be at the pre-charge low logical value.

At a time t155, signal BLPC is applied with a low logical value to turn off transistors N1' and N2'. Signals BL and BLB are therefore floating with the pre-charge low logical value.

At a time t160, word line WL of memory cell 100 is applied with a high logical value. As a result, transistors N13 and N14 are turned on, and the data on nodes ND and NDB are transferred to bit lines BL and BLB as signals SBL and SBLB, respectively. A bit line split between bit line BL and bit line BLB starts to develop, as indicated by signal SBL starting to transition towards a high logical value.

At time t160, signal RDEC is also applied with a high logical value to turn on transistors N5' and N6'. As a result, bit lines BL and BLB are electrically coupled with bit lines RBL and RBLB. Effectively, as shown in FIG. 11, at time t160, signal SRBL follows signal SBL and transitions towards a high logical value. Because bit line RBL has less capacitance than bit line BL, signal SRBL transitions towards the high logical value faster than signal SBL does. Signal SRBLB follows signal SBLB and stays at a low logical value.

At a time t170, when the bit line split between bit lines RBL and RBLB is sufficient to be sensed by sense amplifier SA905, signal SAEB at the gate of transistor P5' is activated with a low logical value. As a result, transistor P5' is turned on and serves as a current path for transistors P3' and P4'. In other words, sense amplifier SA905 is turned on.

Because signal SRBL on bit line RBL transitions towards a high logical value while bit line RBLB stays at the same pre-charge low logical value, a voltage level of bit line RBLB at the gate of transistor P3' is lower than a voltage level of bit line RBL at the gate of transistor P4'. As a result, transistor P3' has a driving capability stronger than that of transistor P4'. Consequently, transistor P3' is turned on before transistor P4'. By the time transistor P3' is turned on, transistors P3' and the then turned-on transistor P5' pull bit line RBL to a high logical value at the source of transistor P5'. Because bit line RBL at the gate of transistor P4' is logically high, even if transistor P4' is then on, transistor P4' is turned off, and has no electrical effect on other circuit elements.

Signals SRBL and SRBLB are each then processed by inverters INV1 and INV2, respectively. For example, inverter INV1 converts a high logical value of signal SRBL to provide a low logical value for output OUT. Similarly, inverter INV2 converts a low logical value of signal SRBLB to provide a high logical value for output OUTB.

Shared Circuit

In some embodiments, similar to sharing of transistors P5, P6, N3, N4, N5 and inverters INV1, INV2 in FIG. 2, transistors N5', N6', P3', P4', P5' and inverters INV1, INV2 in FIG. 9 are shared by a plurality of columns of a memory array of a memory macro.

Figure 12:
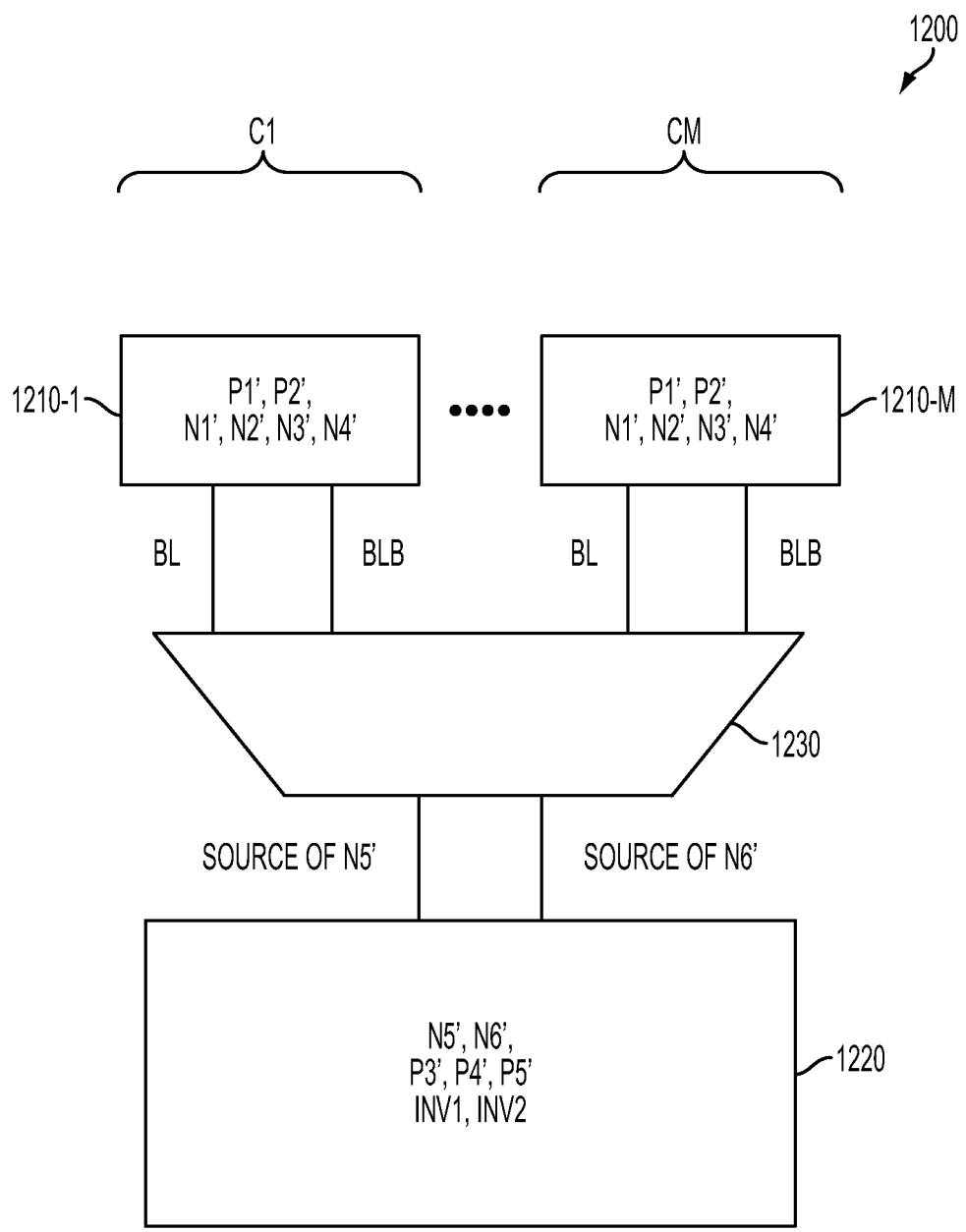
FIG. 12 is a diagram of a circuit having a sub-circuit in FIG. 9 being shared, in accordance with some embodiments.

FIG. 12 is a diagram of a circuit 1200, in accordance with some embodiments. FIG. 12 is used to illustrate how transistors N5', N6', P3', P4', P5' and inverters INV1, INV2 in FIG. 9 are shared.

In some embodiments, M circuits 1210 designated as circuits 1210-1 to 1210-M share a circuit 1220, wherein M is an integer number. Explained in a different way, M columns C1 to CM of a memory array of a memory macro share or use one circuit 1220.

Each circuit 1210-1 to 1210-M includes transistors P1', P2', N1', N2', N3', and N4'. Circuit 1220 includes transistors N5', N6', P3', P4', P5' and inverters INV1, INV2.

A selection circuit 1230 operates to selectively couple bit lines BL and BLB of a circuit 1210 of circuits 1210-1 to 1210-M with the sources of transistors N5' and N6' of circuit 1220, respectively. In some embodiments, selection circuit 1230 is a multiplexer.

When a circuit 1210 is selected by multiplexer 1230 to be coupled with circuit 1220, the resulting circuit is equivalent to circuit 900 in FIG. 9. For example, the resulting circuit includes transistors P1', P2', N1', N2', N3', N4', N5', N6', P3', P4', P5' and inverters INV1, INV2 of circuit 900. Operations of the resulting circuit can be referenced to operations of circuit 900 as explained above.

In some embodiments, a memory array of a memory macro includes a plurality of K circuits 1200 where K is an integer number. For illustrations, M equals to four, and K equals to sixteen. In such a configuration, the memory includes 64 (=4×16) columns, and every four columns share a multiplexer 1230 and a circuit 1220.

Circuits 900 and 1200 include features and advantages similar to those of circuit 200 and circuit 800.

In some embodiments, a circuit includes a plurality of first circuits, a selection circuit, and a second circuit. The selection circuit is configured to selectively couple a first circuit of the plurality of first circuits with the second circuit. The first circuit includes a first data line and a second data line; and a pair of cross-coupled transistors of a first type coupled with the first data line and the second data line and configured to maintain a logical value of the first data or of the second data line. The second circuit includes a first switching circuit and a second switching circuit; and a pair of cross coupled transistors of a second type different from the first type. The pair of cross-coupled transistors of the first circuit and the pair of cross-coupled transistors of the second circuit are configured as part of a sense amplifier when the first switching circuit is configured to electrically couple the first data line to the second circuit and the second switching circuit is configured to electrically couple the second data line to the second circuit.

In some embodiments, a circuit includes a plurality of first circuits; a selection circuit; and a second circuit. The selection circuit is configured to selectively couple a first circuit of the plurality of first circuits with the second circuit to form a third circuit. The first circuit includes a first data line and a second data line; a first transistor of a first type and a second transistor of the first type; a first terminal of the first transistor is coupled with a first terminal of the second transistor and is configured to receive a first voltage value; a second terminal of the first transistor is coupled with a third terminal of the second transistor and with the second data line; and a third terminal of the first transistor is coupled with a second terminal of the second transistor and with the first data line. The second circuit includes a third transistor, a fourth transistor, and a fifth transistor, which all are of a second type different from the first type; a first terminal of the third transistor is coupled with a first terminal of the fourth transistor and with a third terminal of the fifth transistor; a second terminal of the third transistor is coupled with a third terminal of the fourth transistor; a third terminal of the third transistor is coupled with a second terminal of the fourth transistor; a first terminal of the fifth transistor is configured to receive a second voltage value different from the first voltage value; and a second terminal of the fifth transistor is configured to receive a control signal.

In some embodiments, a circuit includes a plurality of first circuits, a selection circuit, and a second circuit. Each first circuit of the plurality of first circuits includes a first data line, a second data line, and a first pair of cross-coupled transistors coupled between the first data line and the second data line. The selection circuit is configured to couple a first data line of a selected first circuit of the plurality of first circuits with a first node and to couple a second data line of the selected first circuit of the plurality of first circuits with a second node. The second circuit includes a first switching circuit coupled between the first node and a third node; a second switching circuit coupled between the second node and a fourth node; and a second pair of cross-coupled transistors coupled between the third node and the fourth node. The first pair of cross-coupled transistors of the selected first circuit of the plurality of first circuits and the second pair of cross-coupled transistors of the second circuit form a sensing amplifier when the first switching circuit and the second switching circuit are turned on.

A number of embodiments have been described. It will nevertheless be understood that various modifications may be made without departing from the spirit and scope of the disclosure. For example, various transistors being shown as a particular dopant type (e.g., NMOS or PMOS) are for illustration purposes. Embodiments of the disclosure are not limited to a particular type. Selecting different dopant types for a particular transistor is within the contemplated scope of the present disclosure. A low or high logical value of various signals used in the above description is also for illustration. Various embodiments are not limited to a particular logical value when a signal is activated and/or deactivated. Selecting different logical values is within the contemplated scope of the present disclosure. In various embodiments, a transistor functions as a switch. A switching circuit used in place of a transistor is within the scope of various embodiments.

In various embodiments, a source of a transistor can be configured as a drain, and a drain can be configured as a source.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
a plurality of first circuits;
a selection circuit; and
a second circuit,
wherein
the selection circuit is configured to selectively couple a first circuit of the plurality of first circuits with the second circuit;
the first circuit includes
a first data line and a second data line; and
a pair of cross-coupled transistors of a first type coupled with the first data line and the second data line and configured to maintain a logical value of the first data line or of the second data line;
the second circuit includes
a first switching circuit and a second switching circuit, the selection circuit being between the first switching circuit and the first data line and the selection circuit being between the second switching circuit and the second data line; and
a pair of cross coupled transistors of a second type different from the first type; and
when the first switching circuit is configured to electrically couple the first data line to the second circuit and the second switching circuit is configured to electrically couple the second data line to the second circuit:
the pair of cross-coupled transistors of the first circuit and the pair of cross-coupled transistors of the second circuit are configured as part of a sense amplifier,
a first signal path of the sense amplifier includes the first data line in series with the selection circuit and the first switching circuit, and
a second signal path of the sense amplifier includes the second data line in series with the selection circuit and the second switching circuit.

2. The circuit of claim 1, wherein
the first switching circuit and the second switching circuit each include a transistor of the first type.

3. The circuit of claim 1, wherein
the first circuit further includes at least one memory cell and a charging circuit; and
the charging circuit and each memory cell of the at least one memory cell are coupled with the first data line and the second data line.

4. The circuit of claim 3, wherein
the charging circuit includes a pair of transistors of the first type.

5. The circuit of claim 1, wherein
the first switching circuit and the second switching circuit are configured such that
in a write operation of a memory cell coupled with the first data line and the second data line, the second circuit is electrically disconnected from the first data line and the second data line; and in a read operation of the memory cell, the first switching circuit and the second switching circuit each operate as an electrically short circuit.

6. The circuit of claim 1, wherein
the various transistors of the first type are P-type transistors; and
the various transistors of the second type are N-type transistors.

7. A circuit comprising:
a plurality of first circuits;
a selection circuit; and
a second circuit,
wherein
the selection circuit is configured to selectively couple a first circuit of the plurality of first circuits with the second circuit to form a third circuit;
the first circuit includes
a first data line and a second data line;
a first transistor of a first type and a second transistor of the first type;
a first terminal of the first transistor is coupled with a first terminal of the second transistor and is configured to receive a first voltage value;
a second terminal of the first transistor is coupled with a third terminal of the second transistor and with the second data line; and
a third terminal of the first transistor is coupled with a second terminal of the second transistor and with the first data line;
the second circuit includes
a first switching circuit and a second switching circuit, the selection circuit being between the first switching circuit and the first data line and the selection circuit being between the second switching circuit and the second data line;
a third transistor, a fourth transistor, and a fifth transistor, which all are of a second type different from the first type;
a first terminal of the third transistor is coupled with a first terminal of the fourth transistor and with a third terminal of the fifth transistor;
a second terminal of the third transistor is coupled with a third terminal of the fourth transistor;
a third terminal of the third transistor is coupled with a second terminal of the fourth transistor;
a first terminal of the fifth transistor is configured to receive a second voltage value different from the first voltage value; and
a second terminal of the fifth transistor is configured to receive a control signal; and
when the first circuit, the selection circuit, and the second circuit are configured in series:
the first transistor, the second transistor, the third transistor and the fourth transistor are configured as part of a sense amplifier,
the selection circuit is a part of a first signal path of the sense amplifier between the first data line and the first switching circuit, and
the selection circuit is a part of a second signal path of the sense amplifier between the second data line and the second switching circuit.

8. The circuit of claim 7, wherein
the first circuit further includes at least one memory cell and a charging circuit; and
the charging circuit and each memory cell of the at least one memory cell are coupled with the first data line and the second data line.

9. The circuit of claim 8, wherein
the charging circuit includes a pair of transistors of the first type.

10. The circuit of claim 7, wherein
a first node of the first switching circuit is coupled with the second terminal of the third transistor and with the third terminal of the fourth transistor; and a second node of the first switching circuit is coupled with the first data line; and
a first node of the second switching circuit is coupled with the third terminal of the third transistor and with the second terminal of the fourth transistor; and a second node of the second switching circuit is coupled with the second data line.

11. The circuit of claim 7, wherein
the first switching circuit includes a sixth transistor;
the second switching circuit includes a seventh transistor;
a first terminal of the sixth transistor is coupled with the first data line;
a second terminal of the sixth transistor is configured to receive a control signal;
a third terminal of the sixth transistor is coupled with the third terminal of the third transistor;
a first terminal of the seventh transistor is coupled with the second data line;
a second terminal of the seventh transistor is configured to receive the control signal; and
a third terminal of the seventh transistor is coupled with the third terminal of the fourth transistor.

12. The circuit of claim 7, wherein
the first switching circuit and the second switching circuit are configured such that
in a write operation of a memory cell coupled with the first data line and the second data line, the first switching circuit and the second switching circuit each operate as an electrically open circuit to electrically disconnect the second circuit from the first data line and the second data line; and
in a read operation of the memory cell, the first switching circuit and the second switching circuit each operate as an electrically short circuit to electrically connect the second circuit to the first data line and the second data line.

13. The circuit of claim 7, wherein
the circuit further comprises a first data circuit and a second data circuit;
a first node of the first switching circuit is coupled with the third terminal of the third transistor and with the second terminal of the fourth transistor; and a second node of the first switching circuit is coupled with the first data line;
a first node of the second switching circuit is coupled with the second terminal of the third transistor and with the third terminal of the fourth transistor; and a second node of the second switching circuit is coupled with the second data line;
the first data circuit, based on data at the first node of the first switching circuit, is configured to generate data at an output of the first data circuit; and
the second data circuit, based on data at the second node of the second switching circuit, is configured to generate data at an output of the first data circuit.

14. The circuit of claim 7, wherein
the circuit further comprises a first inverter and a second inverter;

a first node of the first switching circuit is coupled with the second terminal of the third transistor and with the third terminal of the fourth transistor;

a second node of the first switching circuit is coupled with the first data line;

a first node of the second switching circuit is coupled with the third terminal of the third transistor and with the second terminal of the fourth transistor;

a second node of the second switching circuit is coupled with the second data line;

the first inverter is coupled with the first node of the first switching circuit; and the second inverter is coupled with the first node of the second switching circuit.

15. The circuit of claim 7, wherein the various transistors of the first type are P-type transistors; and the various transistors of the second type are N-type transistors.

16. A circuit comprising:

a plurality of first circuits, each first circuit of the plurality of first circuits comprising:
  a first data line;
  a second data line; and
  a first pair of cross-coupled transistors coupled between the first data line and the second data line;

a selection circuit configured to couple a first data line of a selected first circuit of the plurality of first circuits with a first node and to couple a second data line of the selected first circuit of the plurality of first circuits with a second node; and a second circuit, comprising:
  a first switching circuit coupled between the first node and a third node, the selection circuit being between the first switching circuit and the first data line;
  a second switching circuit coupled between the second node and a fourth node, the selection circuit being between the second switching circuit and the second data line; and
  a second pair of cross-coupled transistors coupled between the third node and the fourth node, the first pair of cross-coupled transistors of the selected first circuit of the plurality of first circuits and the second pair of cross-coupled transistors of the second circuit forming a sensing amplifier when the first circuit, the selection circuit, and the second circuit are configured in series and the first switching circuit and the second switching circuit are turned on, the sensing amplifier comprising:

a first signal path comprising the first data line, the selection circuit, and the first switching circuit in series, and a second signal path comprising the second data line, the selection circuit, and the second switching circuit in series.

17. The circuit of claim 16, wherein:

the first pair of cross-coupled transistors of the selected first circuit of the plurality of first circuits comprises P-type transistors; and the second pair of cross-coupled transistors of the second circuit comprises N-type transistors.

18. The circuit of claim 17, wherein:

the first switching circuit comprises a first P-type transistor; and the second switching circuit comprises a second P-type transistor.

19. The circuit of claim 16, wherein:

the first pair of cross-coupled transistors of the selected first circuit of the plurality of first circuits comprises N-type transistors; and the second pair of cross-coupled transistors of the second circuit comprises P-type transistors.

20. The circuit of claim 19, wherein:

the first switching circuit comprises a first N-type transistor; and the second switching circuit comprises a second N-type transistor.

* * * * *